(12) United States Patent
Sklenard et al.

(10) Patent No.: US 9,018,078 B2
(45) Date of Patent: Apr. 28, 2015

(54) METHOD OF MAKING A 3D INTEGRATED CIRCUIT

(71) Applicants: STMicroelectronics S.A., Montrouge (FR); Commissariat à l'Énergie Atomique et aux Énergies Alternatives, Paris (FR)

(72) Inventors: Benoit Sklenard, Grenoble (FR); Perrine Batude, Grenoble (FR)

(73) Assignees: STMicroelectronics SA, Montrouge (FR); Commissariat a l'Energie Atomique et aux Energies Alternatives, Paris (FR)

( * ) Notice: Subject to any disclaimer, the term of this patent is extended or adjusted under 35 U.S.C. 154(b) by 31 days.

(21) Appl. No.: 13/751,489

(22) Filed: Jan. 28, 2013

(65) Prior Publication Data

US 2013/0193550 A1 Aug. 1, 2013

(30) Foreign Application Priority Data

Feb. 1, 2012 (FR) ...................................... 12 50950

(51) Int. Cl.
*H01L 21/46* (2006.01)
*H01L 23/58* (2006.01)
*H01L 21/02* (2006.01)
*H01L 27/06* (2006.01)
*H01L 27/12* (2006.01)
*H01L 21/822* (2006.01)

(52) U.S. Cl.
CPC ........ *H01L 23/585* (2013.01); *H01L 21/02038* (2013.01); *H01L 27/0688* (2013.01); *H01L 27/1203* (2013.01); *H01L 21/8221* (2013.01)

(58) Field of Classification Search
CPC ..................... H01L 21/76251; H01L 21/6254; H01L 21/2007; H01L 21/76256; H01L 21/6835; H01L 21/187; H01L 2924/14
USPC ........... 438/107, 455, 459, 637; 257/508, 532
See application file for complete search history.

(56) References Cited

U.S. PATENT DOCUMENTS

| 5,567,959 A | 10/1996 | Mineji | |
| 2009/0224364 A1* | 9/2009 | Oh et al. | 257/532 |
| 2010/0190334 A1* | 7/2010 | Lee | 438/637 |

FOREIGN PATENT DOCUMENTS

WO WO 2007139862 A2 12/2007

OTHER PUBLICATIONS

French Search Report dated Jul. 27, 2012 from French application No. 12/50950.
Hong-Seung Kim et al: "Three-dimensional integration: technology, use, and issues for mixed-signal applications", IEEE Transactions on Electron Devices, IEEE Service Center, Piscataway, NJ, US, vol. 50, No. 3, Mar. 1, 2003, pp. 601-609, XP011097052.

* cited by examiner

*Primary Examiner* — Dung Le
(74) *Attorney, Agent, or Firm* — Gardere Wynne Sewell LLP

(57) ABSTRACT

A method for manufacturing an integrated circuit, including the steps of forming first transistors on a first semiconductor layer; depositing a first insulating layer above the first semiconductor layer and the first transistors, and leveling the first insulating layer; depositing a conductive layer above the first insulating layer, and covering the conductive layer with a second insulating layer; bonding a semiconductor wafer to the second insulating layer; thinning the semiconductor wafer to obtain a second semiconductor layer; and forming second transistors on the second semiconductor layer.

20 Claims, 3 Drawing Sheets

METHOD OF MAKING A 3D INTEGRATED CIRCUIT

CROSS REFERENCE TO RELATED APPLICATIONS

This application claims the priority benefit of French patent application number 12/50950, filed on Feb. 1, 2012, which is hereby incorporated by reference to the maximum extent allowable by law.

BACKGROUND

1. Technical field

The present disclosure relates to integrated circuits comprising transistors distributed in several levels. Such integrated circuits comprise a stack of at least two semiconductor layers separated by an insulating layer. This is often referred to as three-dimensional (3D) integration, and 3D integrated circuits.

2. Discussion of the Related Art

Increasing the component density in integrated circuits generally is a constant concern. A solution is to manufacture integrated circuits comprising components distributed in several levels of semiconductor layers.

FIG. 1 is a cross-section view schematically showing an example of a 3D integrated circuit comprising transistors distributed in two levels, the integrated circuit being formed on an SOI-type ("Silicon-On-Insulator") wafer 1.

Wafer 1 comprises a semiconductor substrate 3 covered with an insulating layer 5, currently called BOX ("Buried OXide"), itself coated with a semiconductor layer 7. A conductive layer 4, called rear electrode, may be present in wafer 1 under insulating layer 5.

A MOS transistor T1 formed in semiconductor layer 7 is illustrated. Transistor T1 comprises a conductive gate 9 insulated from the upper surface of semiconductor layer 7 by a gate insulator 11. Spacers 13 surround gate 9. Source and drain areas 15 extend in layer 7 on either side of gate 9. In the following description, transistor T1 is called the lower transistor.

An insulating layer 29 separates semiconductor layer 7 comprising transistor T1 from another semiconductor layer, 17, comprising other MOS transistors such as transistor T2. Transistor T2 comprises a gate 19 arranged on a gate insulator 21, spacers 23, and source and drain regions 25. An insulating layer 33 covers semiconductor layer 17 and transistor T2. In the following description, transistor T2 is called the upper transistor.

Contacts 35 crossing insulating layer 33 provide access to source and drain regions 25 and to gate 19 of transistor T2. Contacts crossing insulating layer 33 and insulating layer 29, not shown, provide access to source and drain regions 15 and to gate 9 of transistor T1.

An example of a method enabling to obtain an integrated circuit such as that illustrated in FIG. 1 is the following.

MOS transistors such as transistor T1 are formed on a wafer 1 by implementing manufacturing steps currently used for MOS transistor manufacturing. Once transistors T1 have been formed, an insulating layer 30 is deposited above the upper surface of semiconductor layer 7 of wafer 1 and above transistors T1, after which insulating layer 30 is leveled.

One of the surfaces of another semiconductor wafer, covered with an insulator layer 31, is then applied on insulating layer 30, to obtain a bonding between wafer 1 comprising transistors T1 and covered with layer 30 and the other wafer. After the bonding, the other wafer is thinned to obtain the desired thickness for semiconductor layer 17.

At this stage of the process, above semiconductor layer 7 comprising transistors T1, a stack of an insulating layer 29, formed of insulating layers 30 and 31, and of a semiconductor layer 17 has been obtained. Manufacturing steps currently used for the manufacturing of MOS transistors are then implemented to manufacture MOS transistors such as transistor T2 in semiconductor layer 17.

In certain applications, it is desirable to be able to dynamically and independently adjust the threshold voltage of the lower transistor and the threshold voltage of the upper transistor.

The threshold voltage of lower transistor T1 may be adjusted by applying a variable voltage to rear electrode 4. Rear electrode 4 is generally formed by high-energy implantation of dopant elements in wafer 1 before the forming of transistor T1. After this implantation step, an anneal for activating the dopant elements is performed, generally at a relatively high temperature, for example, at a temperature greater than 900° C.

Since semiconductor layer 17 supporting upper transistor T2 is separated from semiconductor layer 7 supporting lower transistor T1 by an insulating layer 29, it is not possible to implant dopant elements in insulating layer 29 to also form a rear electrode under upper transistor T2 in order to adjust its threshold voltage.

SUMMARY

An embodiment provides an integrated circuit comprising transistors distributed in several levels, and enabling to dynamically adjust the threshold voltage of transistors located in an upper level.

Another embodiment provides a method for manufacturing an integrated circuit comprising transistors distributed in several levels, and enabling to dynamically adjust the threshold voltage of transistors located in an upper level.

Thus, an embodiment provides a method for manufacturing an integrated circuit, comprising the steps of forming first transistors on a first semiconductor layer; depositing a first insulating layer above the first semiconductor layer and the first transistors, and leveling the first insulating layer; depositing a conductive layer above the first insulating layer, and covering the conductive layer with a second insulating layer; bonding a semiconductor wafer to the second insulating layer; thinning the semiconductor wafer to obtain a second semiconductor layer; and forming second transistors on the second semiconductor layer.

According to an embodiment, the method further comprises, after the step of forming of the second transistors on the second semiconductor layer, a step of deposition of a third insulating layer on the second semiconductor layer and the second transistors, and a step of forming of a contact crossing the third insulating layer and the second insulating layer all the way to the conductive layer.

According to an embodiment, the first insulating layer is made of silicon oxide and has a thickness ranging between 20 and 100 nm between the gates of the first transistors and the conductive layer, and the second insulating layer is made of silicon oxide and has a thickness ranging between 10 and 25 nm According to an embodiment, the conductive layer is made of a metallic material selected from the group comprising titanium, tantalum, and tungsten.

According to an embodiment, the conductive layer is made of doped polysilicon.

According to an embodiment, the method further comprises, before the step of bonding the semiconductor wafer to the second insulating layer, a step of forming of a fourth insulating layer on the semiconductor wafer.

According to an embodiment, the first semiconductor layer is the upper portion of another semiconductor wafer.

An embodiment provides an integrated circuit comprising, in stacked fashion: a first semiconductor layer comprising at least one first transistor; a first insulating layer; a conductive layer; a second insulating layer; and a second semiconductor layer comprising at least one second transistor.

According to an embodiment, the conductive layer is connected to a pad capable of receiving a bias voltage.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

Figure 1:
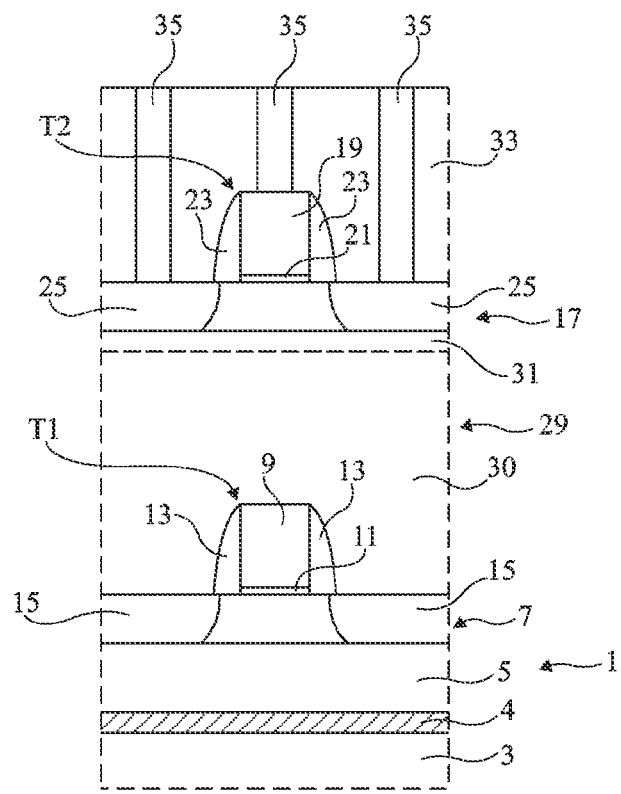
FIG. 1, previously described, is a cross-section view schematically showing an example of a 3D integrated circuit.
Figure 2:
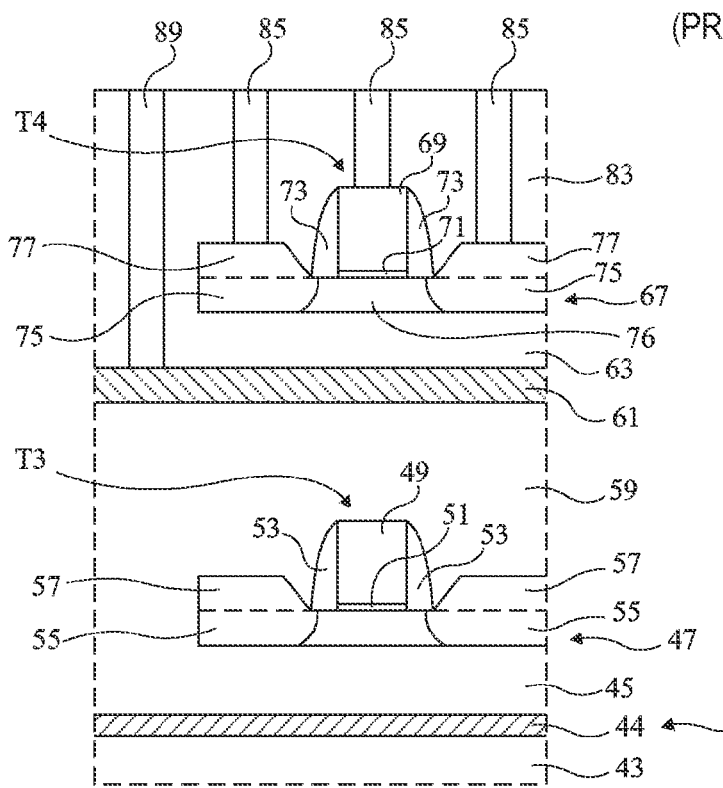
FIG. 2 is a cross-section view schematically showing a 3D integrated circuit comprising two stacked semiconductor layers, in which the threshold voltage of the transistors located on the semiconductor layer of the upper level is adjustable.

FIG. 2 is a cross-section view schematically showing a 3D integrated circuit formed on a wafer 41.

Wafer 41 for example is an SOI-type wafer, comprising a semiconductor substrate 43, for example, made of silicon, covered with an insulating layer 45, for example, made of silicon oxide, itself covered with a semiconductor layer 47, for example, made of silicon. Wafer 41 may also be a so-called solid semiconductor substrate, for example, a silicon wafer. A conductive layer 44, called rear electrode, generally obtained by drive in, may be present in wafer 41, between insulating layer 45 and substrate 43.

As an example of order of magnitude, in the case of an SOI wafer, the thickness of insulating layer 45 ranges between 10 and 145 nm, and for example is on the order of 25 nm, and the thickness of semiconductor layer 47 for example ranges between 3 and 100 nm Semiconductor layer 47 comprises MOS transistors such as transistor T3. Transistor T3 comprises a gate 49 arranged on a gate insulator 51, spacers 53, and source and drain regions 55.

In the case where layer 47 has a low thickness, for example, ranging between 3 and 15 nm, for example, on the order of 6 nm, the epitaxy is resumed above layer 47, after the forming of gate 49 and spacers 53, to obtain a semiconductor layer 57 above source and drain regions 55. Semiconductor layer 57 enables to form a contacting silicide layer on source and drain regions 55 while maintaining a sufficient thickness for the source and drain regions. The total thickness of layers 55 and 57 for example ranges between 20 and 30 nm, and for example is on the order of 25 nm.

An insulating layer 59 covers the upper surface of semiconductor layer 47 (or 57) and transistor T1. A conductive layer 61 covers insulating layer 59. Conductive layer 61 is made of a metallic material, for example titanium (Ti), tantalum (Ta), or tungsten (W), or of doped polysilicon. An insulating layer 63 covers conductive layer 61.

As an example, insulating layer 59 is made of silicon oxide and the thickness of the portion of insulating layer 59 placed between gate 49 of transistor T3 and conductive layer 61 ranges between 20 and 100 nm, and for example is on the order of 25 nm. Insulating layer 63 is for example made of silicon oxide and has a thickness for example ranging between 10 and 25 nm, for example, on the order of 15 nm.

A semiconductor layer 67 is located above insulating layer 63 and comprises other MOS transistors such as transistor T4. Transistor T4 comprises a gate 69 arranged on a gate insulator 71, spacers 73, and source and drain regions 75. Under gate 69 and between source and drain 75 is defined a channel region 76. Like for transistor T3, the epitaxy may have been resumed to form a semiconductor layer 77 above source and drain regions 75.

The thickness of semiconductor layer 67 for example ranges between 3 and 15 nm, and for example is on the order of 6 nm The thickness of layer 77 for example ranges between 10 and 20 nm and for example is on the order of 15 nm.

An insulating layer 83 covers the upper surface of the structure. Contacts 85 crossing insulating layer 83 provide access to source and drain regions 75 and to gate 69 of transistor T4.

Conductive layer 61 extends at least under channel region 76 of transistor T4, to obtain an electrostatic coupling between conductive layer 61 and channel region 76 to be able to adjust the threshold voltage of transistor T4. Conductive layer 61 is interrupted where contacts providing access to source and to drain 55 of lower transistor T3 are formed.

A contact 89 crossing insulating layers 83 and 63 provides access to conductive layer 61. Contact 89 is connected to a pad capable of receiving a bias voltage. Thus, a variable voltage can be applied on conductive layer 61.

The nature of the insulating material(s) of layer 63 as well as its thickness are selected to provide a good electrostatic coupling between conductive layer 61 and channel region 76 of upper transistor T4.

Thus, a modification of the voltage applied on conductive layer 61 enables to adjust the threshold voltage of upper transistor T4. Further, conductive layer 61 behaves as an electrostatic shield between lower transistor T3 and upper transistor T4.

FIGS. 3A to 3E are cross-section views schematically showing successive steps of a method for manufacturing a 3D integrated circuit of the type illustrated in FIG. 2.

Figure 3A:
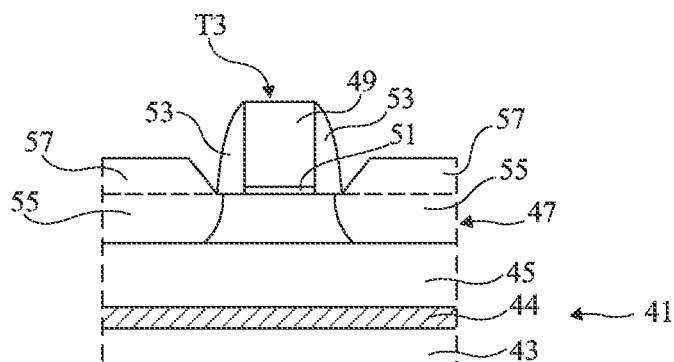
FIGS. 3A to 3E are cross-section views schematically showing successive steps of a method for manufacturing a 3D integrated circuit of the type illustrated in FIG. 2.

FIG. 3A shows an SOI-type wafer 41 on which MOS transistors such as transistor T3 have been formed. A rear electrode 44 has been formed by implantation of dopant elements in wafer 41 before the forming of transistor T3. After this implantation step, an anneal for activating the dopant elements has been performed, for example at a temperature ranging between 900 and 1,100° C., for example, on the order of 900° C. Steps currently used for the manufacturing of MOS transistors have then been implemented to manufacture MOS transistor T3.

Figure 3B:
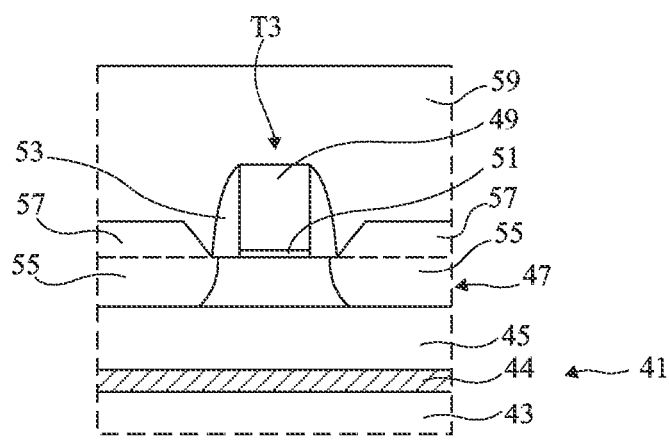

FIG. 3B illustrates a step of deposition of an insulating layer 59 above semiconductor layer 47 (or 57) and above transistor T3. The deposition of insulating layer 59 is for example performed by high-density plasma deposition (HDP) from a precursor of tetraethoxysilane ($Si(OC_2H_5)_4$), commonly called TEOS. After having been deposited, layer 59 has been leveled, for example, by chem.-mech. polishing.

Figure 3C:
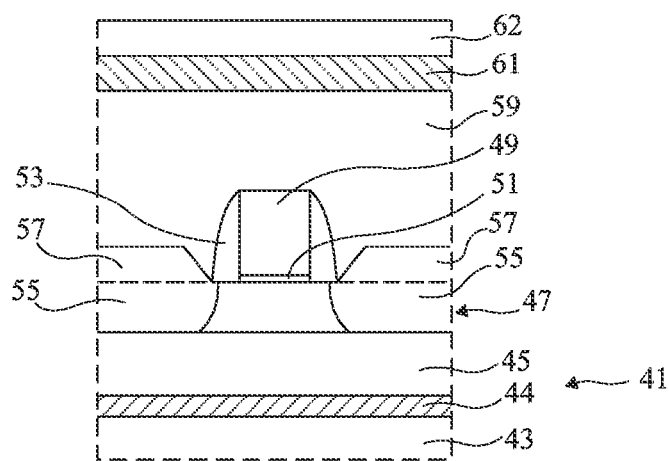

FIG. 3C illustrates the structure after deposition of a conductive layer 61, for example, by chemical vapor deposition (CVD), above the upper surface of insulating layer 59. An insulating layer 62, for example, made of silicon oxide, has then been formed above conductive layer 61.

Figure 3D:
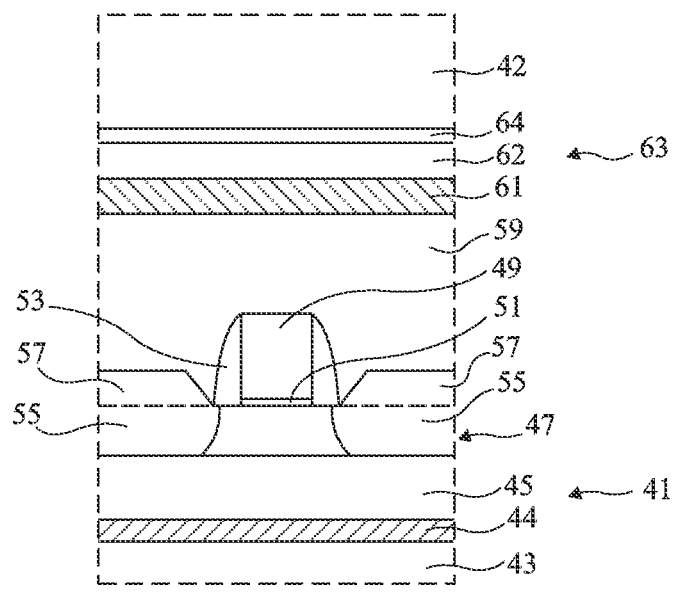

FIG. 3D illustrates a step of bonding of one of the surfaces of another wafer 42, for example, a silicon substrate, preferably previously covered with an insulating layer 64, on the upper surface of the structure in the state illustrated in FIG. 3C.

Figure 3E:
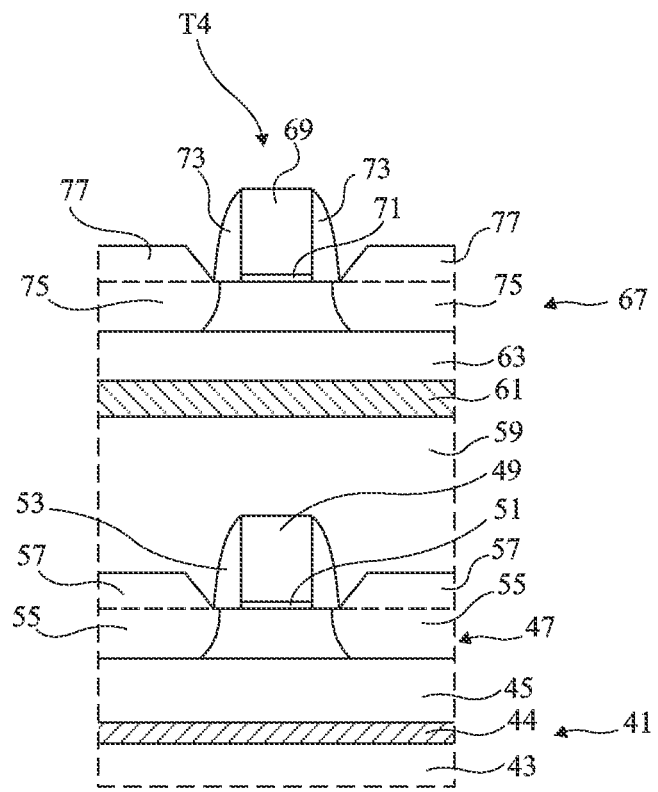

FIG. 3E illustrates the structure after thinning of wafer 42, which has enabled to obtain a semiconductor layer 67 of desired thickness. The thickness of semiconductor layer 67 for example ranges between 3 and 15 nm, and for example is on the order of 6 nm Steps currently used for the manufacturing of MOS transistors have then been implemented to form MOS transistors such as transistor T4 on semiconductor layer 67.

After the deposition of an insulating layer 83 above layer 67 (or 77) and transistor T4, the forming of contacts providing access to the sources, drains, and gates of transistors T3 and T4, and the forming of a contact 89 providing access to conductive layer 61, a structure of type illustrated in FIG. 2 is obtained.

An advantage of an integrated circuit of the type illustrated in FIG. 2 is that conductive layer 61 between the upper level transistor and the lower level transistor creates an electrostatic isolation between the two transistors.

An advantage of a method of the type described in relation with FIGS. 3A to 3E is that the upper level structure is formed without implying any high-temperature processing.

Specific embodiments have been described. Various alterations, modifications, and improvements will occur to those skilled in the art. In particular, although a 3D integrated circuit manufactured on an SOI-type structure has been described, a so-called solid semiconductor substrate, for example, made of silicon, may be used. Further, although a 3D integrated circuit comprising MOS transistors distributed in two levels of semiconductor layers, the present invention of course applies to the case of a stack of more than two semiconductor layer levels.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method for manufacturing an integrated circuit, comprising the steps of:
   forming first transistors on a first semiconductor layer;
   depositing a first insulating layer above the first semiconductor layer and the first transistors;
   leveling the first insulating layer;
   depositing a conductive layer above the first insulating;
   covering the conductive layer with a second insulating layer;
   bonding a semiconductor wafer to the second insulating layer;
   thinning the semiconductor wafer to obtain a second semiconductor layer; and
   forming second transistors on the second semiconductor layer.

2. The method of claim 1, further comprising, after the step of forming of the second transistors on the second semiconductor layer, a step of depositing of a third insulating layer on the second semiconductor layer and the second transistors, and a step of forming of an electrical contact crossing the third insulating layer and the second insulating layer to make contact with the conductive layer.

3. The method of claim 1, wherein the first insulating layer is made of silicon oxide and has a thickness ranging between 20 and 100 nm between the gates of the first transistors and the conductive layer, and wherein the second insulating layer is made of silicon oxide and has a thickness ranging between 10 and 25 nm.

4. The method of claim 1, wherein the conductive layer is made of a metallic material selected from the group comprising titanium, tantalum, and tungsten.

5. The method of claim 1, wherein the conductive layer is made of doped polysilicon.

6. The method of claim 1, further comprising, before the step of bonding the semiconductor wafer to the second insulating layer, a step of forming of a fourth insulating layer on the semiconductor wafer.

7. The method of claim 1, wherein the first semiconductor layer is the upper portion of another semiconductor wafer.

8. An integrated circuit comprising, in stacked fashion:
   a first semiconductor layer comprising at least one first transistor;
   a first insulating layer covering the at least one first transistor;
   a conductive layer covering the first insulating layer;
   a second insulating layer covering the conductive layer; and
   a second semiconductor layer covering the second insulating layer and comprising at least one second transistor.

9. The integrated circuit of claim 8, further comprising:
   a third insulating layer covering the at least one second transistor; and
   a conductive via extending through the second and third insulating layers to make electrical contact with he conductive layer, said conductive via configured to be connected to a pad capable of receiving a bias voltage.

10. The method of claim 1, further comprising forming a conductive via extending through the second insulating layer to make electrical contact with the conductive layer.

11. The method of claim 1, further comprising configuring the conductive layer for having an effect on a threshold voltage of the second transistors.

12. The method of claim 11, wherein configuring comprises forming a conductive via extending through the second insulating layer to make electrical contact with the conductive layer for the purpose of applying a biasing voltage to the conductive layer.

13. The method of claim 1, wherein the first semiconductor layer is a portion of a silicon on insulator substrate.

14. A method for manufacturing an integrated circuit, comprising the steps of:
   forming first transistors on a first semiconductor layer;
   depositing a first insulating layer above the first semiconductor layer and the first transistors;
   depositing a conductive layer directly on a top surface of the first insulating layer;
   covering a top surface of the conductive layer with a second insulating layer;
   bonding a first surface of a semiconductor wafer to a top surface of the second insulating layer;
   thinning a second surface of the semiconductor wafer to obtain a second semiconductor layer;

forming second transistors on the second semiconductor layer;

depositing a third insulating layer above the second semiconductor layer and the second transistors; and forming a first electrical via extending through the second and third insulating layer to make electrical contact with the conductive layer.

15. The method of claim 14, further comprising:

forming second electrical vias extending through the first, second and third insulating layers to make electrical contact with the first transistors; and forming third electrical vias extending through the third insulating layer to make electrical contact with the second transistors.

16. The method of claim 14, wherein the first surface of the semiconductor wafer that is bonded to the top surface of the second insulating layer is a surface of a fourth insulating layer on the semiconductor substrate layer.

17. The method of claim 14, wherein the conductive layer is made of tungsten.

18. The method of claim 14, wherein the conductive layer is made of doped polysilicon.

19. The method of claim 14, further comprising configuring the conductive layer for having an effect on a threshold voltage of the second transistors.

20. The method of claim 19, wherein configuring comprises configuring the first conductive via for the purpose of applying a biasing voltage to the conductive layer.

\* \* \* \* \*

UNITED STATES PATENT AND TRADEMARK OFFICE
CERTIFICATE OF CORRECTION

| | | |
|---|---|---|
| PATENT NO. | : 9,018,078 B2 | Page 1 of 1 |
| APPLICATION NO. | : 13/751489 | |
| DATED | : April 28, 2015 | |
| INVENTOR(S) | : Sklenard et al. | |

It is certified that error appears in the above-identified patent and that said Letters Patent is hereby corrected as shown below:

In the Claims:

At column 6, claim number 9, line number 39, delete "he" and add the

Signed and Sealed this
Twenty-fifth Day of August, 2015

Michelle K. Lee
*Director of the United States Patent and Trademark Office*